(12) United States Patent
Davidson (10) Patent No.: US 11,088,689 B2
(45) Date of Patent: Aug. 10, 2021

(54) SWITCHING APPARATUS

(71) Applicant: GENERAL ELECTRIC COMPANY, Schenectady, NY (US)

(72) Inventor: Colin Charnock Davidson, Stafford (GB)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 16/966,273

(22) PCT Filed: Jan. 31, 2019

(86) PCT No.: PCT/EP2019/052355
§ 371 (c)(1),
(2) Date: Jul. 30, 2020

(87) PCT Pub. No.: WO2019/149808
PCT Pub. Date: Aug. 8, 2019

(65) Prior Publication Data
US 2020/0373921 A1    Nov. 26, 2020

(30) Foreign Application Priority Data

Jan. 31, 2018 (EP) .................... 18154448

(51) Int. Cl.
*H03K 17/567* (2006.01)
*H02H 3/05* (2006.01)
(52) U.S. Cl.
CPC ............. *H03K 17/567* (2013.01); *H02H 3/05* (2013.01)
(58) Field of Classification Search
None
See application file for complete search history.

(56) References Cited

U.S. PATENT DOCUMENTS

| | | |
|---|---|---|
| 2,849,659 A | 8/1958 | Kesselring |
| 2018/0259568 A1* | 9/2018 | Clauter .................. G01R 31/26 |

FOREIGN PATENT DOCUMENTS

| | | |
|---|---|---|
| EP | 1684318 A1 | 7/2006 |
| GB | 1566289 A | 4/1980 |
| WO | 2014/142974 A1 | 9/2014 |

OTHER PUBLICATIONS

International Search Report of PCT/EP2019/052355 dated Feb. 25, 2019.

(Continued)

*Primary Examiner* — Cassandra F Cox
(74) *Attorney, Agent, or Firm* — Eversheds Sutherland (US) LLP (57) ABSTRACT

A switching apparatus comprises: a first current-conductive branch (12) including a first switching element (24), the first switching element (24) configured to be switchable to selectively permit and block a flow of current in the first current-conductive branch (12); a second current-conductive branch (14) including a second switching element (32), the second switching element (32) configured to be switchable to selectively permit and block a flow of current in the second current-conductive branch (14); and first and second terminals (18,20) for connection, in use, to an electrical network (22), wherein the first and second current-conductive branches (12,14) extend between the first and second terminals (18,20), wherein the switching apparatus further includes an inductance element (44) configured to carry, in use, a current flowing through the switching apparatus, the inductance element (44) electrically coupled to the second switching element (32) so that the inductance element (44) is configured as a power source for enabling the operation of the second switching element (32).

15 Claims, 4 Drawing Sheets

(56) References Cited

OTHER PUBLICATIONS

European Search Report for Application No. 18154418.7 dated Jun. 21, 2018.

* cited by examiner

SWITCHING APPARATUS

CROSS-REFERENCE TO RELATED APPLICATIONS

This application is a U.S. National Stage Application under 35 U.S.C. 371 and claims the priority benefit of International Application No. PCT/EP2019/052355 filed Jan. 31, 2019, which claims priority to EP18154448.7, filed Jan. 31, 2018, which are both incorporated herein by reference.

This invention relates to a switching apparatus, preferably a switching apparatus for use in a circuit interruption device.

It is known to use a switching apparatus with parallel-connected current-conductive branches, where the switching apparatus is capable of commutating current between the parallel-connected current-conductive branches.

According to an aspect of the invention, there is provided a switching apparatus comprising:

- a first current-conductive branch including a first switching element, the first switching element configured to be switchable to selectively permit and block a flow of current in the first current-conductive branch;
- a second current-conductive branch including a second switching element, the second switching element configured to be switchable to selectively permit and block a flow of current in the second current-conductive branch; and
- first and second terminals for connection, in use, to an electrical network, wherein the first and second current-conductive branches extend between the first and second terminals,
- wherein the switching apparatus further includes an inductance element configured to carry, in use, a current flowing through the switching apparatus, the inductance element electrically coupled to the second switching element so that the inductance element is configured as a power source for enabling the operation of the second switching element.

The configuration of the inductance element and the second switching element in the switching apparatus of the invention provides a power supply mechanism by which the energy for powering the second switching element can be derived from a current flowing through the switching apparatus, which for example may be during a normal or fault operation of the switching apparatus. More specifically, a change in current flowing through the switching apparatus results in a corresponding change in current through the inductance element, which in turn generates a voltage across the inductance element which can be used to drive the operation of the second switching element. This beneficially obviates the need for a stand-alone power source coupled to the second switching element, thus providing savings in terms of hardware cost, size and weight. In addition, the use of the inductance element to draw energy from the current flowing through the switching apparatus provides a reliable means of deriving energy from the current flowing through the switching apparatus to provide a required amount of power to the second switching element even when the first and second terminals are at voltage levels which may be incompatible with the power requirements associated with the operation of the second switching element.

In addition, by way of the inductance element being configured as a power source for enabling the operation of the second switching element, a change in the current flowing through the switching apparatus can be used as a trigger for the operation of the second switching element. This allows the configuration of the second switching element to be responsive to certain changes in the current flowing through the switching apparatus.

In a preferred embodiment of the invention, the inductance element may be connected in series with the first or second terminal.

The inductance element may be configured as a power source for enabling a switching operation of the second switching element. For example, in embodiments of the invention, the operation of the second switching element may include at least one of:

- a turn-on of the second switching element;
- a turn-off of the second switching element.

In a preferred embodiment of the invention, the second switching element may include at least one gas tube switch. It will be understood that the second switching element may include a single gas tube switch or a plurality of gas tube switches (e.g. a plurality of series-connected gas tube switches).

A single gas tube switch is capable of providing a single high-voltage switch with a voltage rating of hundreds of kV. Hence, the use of the gas tube switch(es) in the second switching element allows for a cheaper and more compact configuration of the switching apparatus when compared to a switching apparatus based on a switching element having a plurality of semiconductor switches with an equivalent combined voltage rating. The configuration of the switching apparatus of the invention permits the supply of energy from the current flowing through the switching apparatus to the second switching element, via the inductance element, in a manner compatible with the power requirements of the turn-on and turn-off operations of the gas tube switch(es).

The inductance element may be configured as a power source for enabling one or more auxiliary operations of the second switching element. The inductance element can be configured to supply power in a manner commensurate with the electrical requirements of the or each auxiliary operation of the second switching element.

In particular, the inductance element may be configured as a power source compatible with the power requirements of one or more auxiliary operations of the second switching element including the or each gas tube switch. For example, in embodiments of the invention employing the use of at least one gas tube switch, the operation of the second switching element may include at least one of:

- operating at least one monitoring device (e.g. a current sensor, a voltage sensor, a gas pressure sensor, a temperature sensor) to monitor an operating state (e.g. current, voltage, internal gas pressure, temperature) of the or each gas tube switch, wherein the switching apparatus includes the or each monitoring device;
- operating an or a respective electrode to control an or a respective electric field in the or each gas tube switch so as to maintain a or a respective conductive plasma in the or each gas tube switch, wherein the or each gas tube switch includes the or the respective electrode;
- operating at least one gas pressure controller to control an internal gas pressure in the or each gas tube switch, wherein the switching apparatus includes the or each gas pressure controller.

The inventor has identified various ways of electrically coupling the inductance element to the second switching element in order to configure the inductance element as a power source for enabling the operation of the second switching element, non-limiting examples of which are described as follows.

In embodiments of the invention, the inductance element may be electrically coupled to the second switching element to form a galvanically isolated electrical connection between the inductance element and the second switching element, and the galvanically isolated electrical connection may be arranged to configure the inductance element as a power source for enabling the operation of the second switching element.

The provision of a galvanically isolated electrical connection between the inductance element and the second switching element allows for flexibility in the design of the switching apparatus to accommodate differences between the electrical potentials of the power source and the second switching element.

In such embodiments, the galvanically isolated electrical connection may include a transformer. The inclusion of the transformer provides a reliable means of forming the galvanically isolated electrical connection between the inductance element and the second switching element.

In further embodiments of the invention, the inductance element and a cathode terminal of the second switching element may be connected to a common node. This allows the switching apparatus to be configured such that the inductance element (source) and the second switching element (load) are at the same, or substantially the same, electrical potential which allows for a reduction in the voltage isolation requirements of the inductance element.

Optionally each of the first and second switching elements may be configured as a unidirectional or bidirectional switching element. The invention is applicable to the configuration of the switching apparatus as a unidirectional or bidirectional switching apparatus.

According to a second aspect of the invention, there is provided an electrical assembly comprising at least one switching apparatus according to the first aspect of the invention or any one of its embodiments described hereinabove.

The electrical assembly may include a current injection circuit configured to inject an alternating current to flow through the inductance element of the or each switching apparatus. The injected alternating current may be superimposed on the existing current flowing through the or each switching apparatus. The flow of the injected alternating current through the or each inductance element generates a voltage across the or each inductance element which can be used to drive the operation of the second switching element(s).

The current injection circuit may include a current transformer. This provides a reliable means of injecting the alternating current to flow through the inductance element of the or each switching apparatus in a controlled manner.

The electrical assembly may include at least one line trap configured to confine the injected alternating current in a current loop including the inductance element of the or each switching apparatus. The line trap may be configured to present a high impedance to prevent the injected alternating current from escaping to the rest of the electrical network. The line trap may include one or passive electrical components.

Optionally the electrical assembly may include a plurality of switching apparatus connected in series.

In a preferred embodiment of the invention, the electrical assembly may be a circuit interruption device, optionally a DC circuit interruption device.

For the purposes of this specification, opening a circuit interruption device refers to the use of the circuit interruption device to open a closed circuit to interrupt current flow in the circuit, while closing a circuit interruption device refers to the use of the circuit interruption device to complete an open circuit to permit current flow in the circuit. A DC circuit interruption device may be any device that is capable of interrupting direct current flow in a DC circuit. Such a DC circuit interruption device may be, but is not limited to, a DC circuit breaker.

The circuit interruption device may further include an energy absorption device, e.g. a surge arrester, wherein switching operations of the first and second switching elements may be configured so that a current initially flowing in the first current-conductive branch is interrupted by first commutating the current from the first current-conductive branch to the second current-conductive branch and then commutating the current from the second current-conductive branch to the energy absorption device.

The configuration of the switching apparatus of the invention permits the supply of energy from the current flowing through the switching apparatus to the second switching element, via the inductance element, even when the circuit interruption device is designed to operate at high voltage levels, e.g. hundreds of kV, which may be incompatible with the power requirements of the operation of the second switching element.

In a preferred embodiment of the invention, the switching apparatus may be configured for use in a HVDC application.

It will be appreciated that the use of the terms "first" and "second", and the like, in this patent specification is merely intended to help distinguish between similar features (e.g. the first and second current-conductive branches, the first and second switching elements), and is not intended to indicate the relative importance of one feature over another feature, unless otherwise specified.

Preferred embodiments of the invention will now be described, by way of non-limiting examples, with reference to the accompanying drawings in which.

The figures are not necessarily to scale, and certain features and certain views of the figures may be shown exaggerated in scale or in schematic form in the interests of clarity and conciseness.

The following embodiments of the invention are used primarily in HVDC applications, but it will be appreciated that the following embodiments of the invention are applicable mutatis mutandis to other switching applications.

Figure 1:
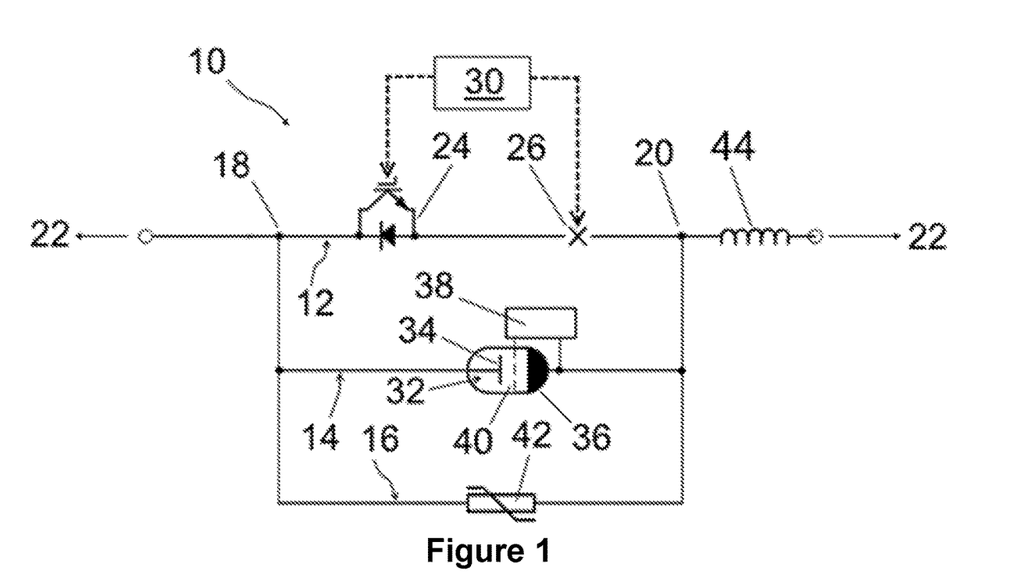
FIG. 1 shows schematically a DC circuit breaker according to a first embodiment of the invention.

A DC circuit breaker according to a first embodiment of the invention is shown in FIG. 1, and is designated generally by the reference numeral 10.

The DC circuit breaker 10 comprises a switching apparatus, which includes a first current-conductive branch 12, a second current-conductive branch 14 and an energy absorption branch 16. The first current-conductive branch 12, second current-conductive branch 14 and energy absorption branch 16 are connected in parallel between first and second DC terminals 18,20. In use, the first and second DC terminals 18,20 are connected to a DC electrical network 22 such that the DC circuit breaker 10 can be configured to carry a DC load current.

The first current-conductive branch 12 includes a first switching element 24 and a mechanical switching element 26, which are connected in series. The first switching element 24 includes a low voltage switching device in the form of an insulated gate bipolar transistor (IGBT). The mechanical switching element 26 includes an ultra-fast mechanical switch in the form of a vacuum switch, but may instead include another type of mechanical switch such as a gas insulated interrupter or more particularly an $SF_6$-insulated interrupter.

The switching apparatus further includes a first switching controller 30 which is configured to control the switching of the IGBT and mechanical switching element 26 so that, in use, each of the first and mechanical switching elements 24,26 are switchable to selectively permit and block a flow of current in the first current-conductive branch 12.

The second current-conductive branch 14 includes a second switching element 32. The second switching element 32 includes a gas tube switch. The gas tube switch includes a chamber enclosing an ionizable gas, such as hydrogen, helium or other suitable gases, and is configured to generate a plasma of ionized gas in the gas tube switch. In use, a controlled flow of electrical current is conducted from an anode 34 to a cathode 36 through the gas in the chamber. The gas tube switch further includes a "keep-alive" grid electrode (not shown) which is operable to maintain a weak conductive plasma within the chamber to facilitate the operation of the gas tube switch without, for example, the use of an ignitor.

The switching apparatus further includes a second switching controller 38 which is configured to control the switching of the gas tube switch so that, in use, the second switching element 32 is switchable to selectively permit and block a flow of current in the second current-conductive branch 14. More particularly, the second switching controller 38 includes a gate drive connected to the cathode 36 and a gate 40 of the gas tube switch which allows the gate drive to control a voltage across the cathode 36 and gate 40 for controlling the turn-on and turn-off of the gas tube switch.

The energy absorption branch 16 includes an energy absorption device in the form of a metal-oxide surge arrester 42.

The switching apparatus further includes an inductance element 44 in the form of a single inductor which is connected in series with the second DC terminal 20.

Operation of the DC circuit breaker 10 to interrupt current in the DC electrical network 22 is described as follows.

In the normal mode of operation of the DC circuit breaker 10, the first and mechanical switching elements 24,26 are closed to permit current to flow through the first current-conductive branch 12 while the second switching element 32 is opened to block current from flowing through the second current-conductive branch 14, so that a DC load current flows through the first current-conductive branch 12. Meanwhile little to no current flows through the energy absorption branch 16.

Figure 2:
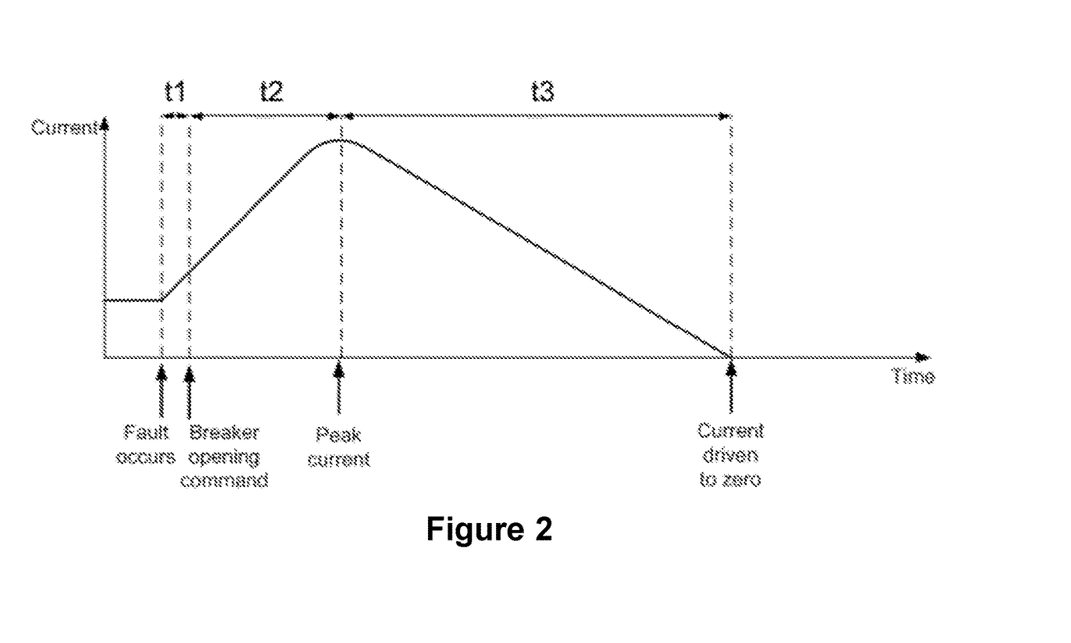
FIG. 2 illustrates a current interruption operation of the DC circuit breaker of FIG. 1.

A fault or other abnormal operating condition in the DC electrical network 22 may lead to high fault current flowing through the DC electrical network 22. In response to an event of high fault current in the DC electrical network 22, the DC circuit breaker 10 is operated to interrupt the high fault current as shown in FIG. 2 which illustrates the profile of current through the DC circuit breaker 10 during a fault clearing event.

At the instant of fault inception, the current through the DC circuit breaker 10 starts rising rapidly at a rate given by V/L, where V is the voltage of the DC electrical network 22 and L is the total inductance of the DC electrical network power supply and any added inductance in the DC circuit breaker 10 itself. After a time following the occurrence of the fault, the DC circuit breaker 10 is commanded to open, which results in the turn-off of the IGBT in the first current-conductive branch 12 to provide a commutating electromotive force, typically a few kV, for diverting the fault current into the second current-conductive branch 14. This is shortly followed by the turn-on of the gas tube switch to permit the fault current to flow in the second current-conductive branch 14.

Thereafter, the fault current continues to rise until it reaches a peak current at a further time t2, which is when the mechanical switching element 26 is fully open and the gas tube switch is turned off to divert the fault current into the energy absorption branch 16. At the end of the fault current interruption process (as indicated by the period t3 in FIG. 2), the surge arrester of the energy absorption branch 16 provides the back-electromotive force to force the fault current down to zero (or a negligible amount close to zero).

The gas tube switch is suitable for use in the second current-conductive branch 14 to temporarily carry the fault current until the mechanical switching element 26 is fully opened to then allow the fault current to be diverted to the energy absorption branch 16. This is mainly due to its compactness and its inherent ability to provide a single high-voltage switch with a voltage rating of hundreds of kV, which allows the second switching element 32 to be cheaper and more compact when compared to a switching element based on a plurality of semiconductor switches with an equivalent combined voltage rating.

Figure 3:
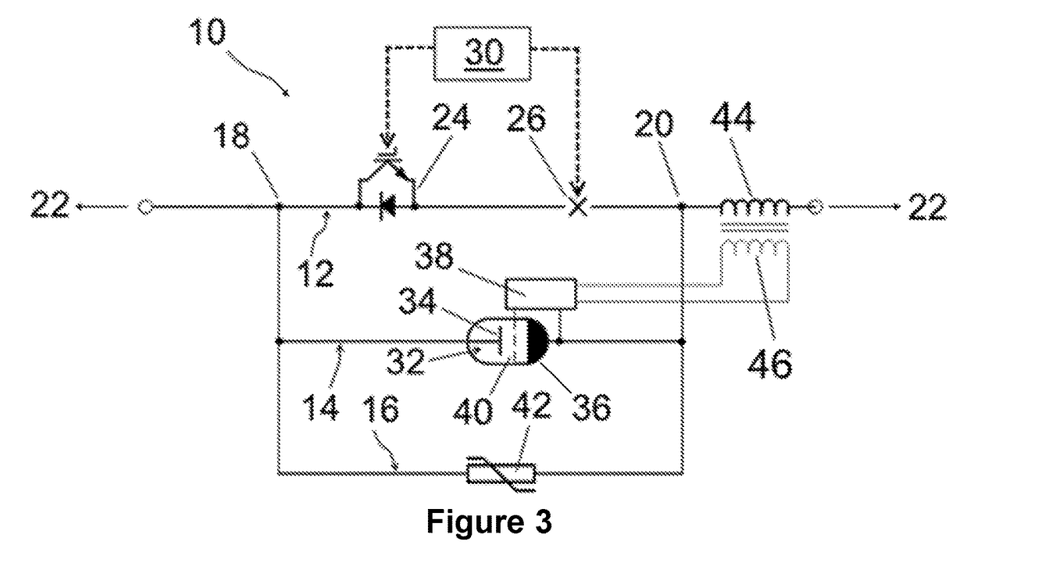
FIG. 3 shows schematically a galvanically isolated electrical connection of the DC circuit breaker of FIG. 1.

In order to supply power to the gas tube switch, the inductor 44 is electrically coupled to the gas tube switch so that the inductor 44 is configured as a power source for enabling the operation of the gas tube switch. FIG. 3 shows an exemplary coupling of the inductor 44 to the gate drive of the second switching controller 38. The inductor 44 is configured as a primary transformer winding which is mutually coupled with a secondary transformer winding 46, that is to say that the inductor 44 and secondary transformer winding 46 in combination form a transformer. The secondary transformer winding 46 is electrically coupled to the gate drive. In this way a galvanically isolated electrical connection is formed between the inductor 44 and the gate drive to enable the transmission of power from the inductor 44 to the gate drive. This allows the inductor 44 to be configured as a power source to supply power to the gate drive for enabling the switching of the gas tube switch.

The size of the transformer may vary depending on the required level of isolation between the inductor 44 and the secondary transformer winding 46. For example, the transformer may be configured to be physically small, since only a few kV of isolation between the inductor 44 and the secondary transformer winding 46 is required.

During the "t2" period of the fault current interruption process, the rise in fault current flowing through the switching apparatus results in the generation of a voltage across the inductor 44, which in turn generates a voltage across the secondary transformer winding 46. The voltage across the secondary transformer winding 46 acts as a driving voltage for the gate drive. Hence, the voltage across the inductor 44 can be used as a source of energy for the gate drive of the gas tube switch to carry out the turn-on and turn-off of the gas tube switch in the fault current interruption process.

In the switching apparatus, the inductor 44 and the cathode 36 of the gas tube switch are both connected to a common node, which is the second DC terminal 20 shown in FIGS. 1 and 3. This allows the inductor 44 and the gate drive to be at the same, or substantially the same, electrical potential which allows for a reduction in the voltage isolation requirements of the inductor 44.

In other embodiments of the invention, it is envisaged that the inductor 44 may be connected in series with the first DC terminal 18. In such embodiments, the transformer may require a voltage isolation level of several hundred kV between the inductor 44 and the secondary transformer winding 46, thus resulting in a bulky and expensive transformer.

The above embodiment is applicable to a unidirectional DC circuit breaker for clearing a fault current in one direction, which in FIGS. 1 and 3 is from left to right.

The invention is also applicable to a bidirectional DC circuit breaker for clearing a fault current in both directions, as follows.

Figure 4:
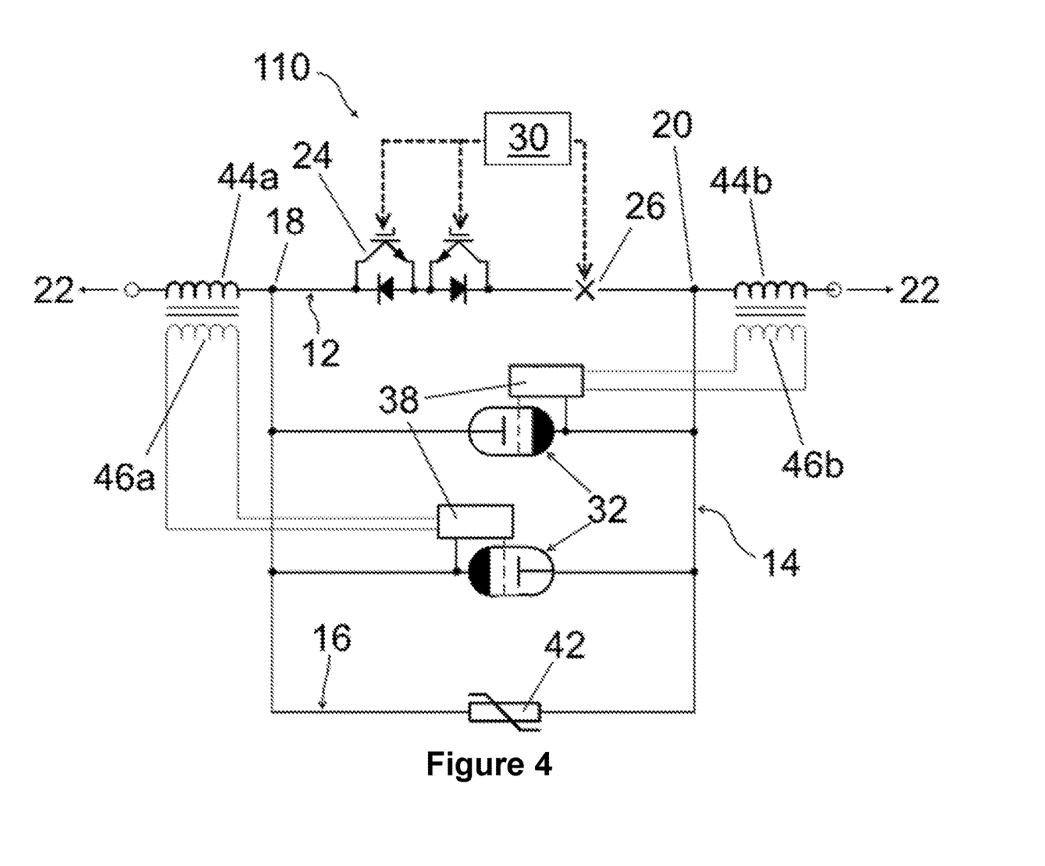
FIG. 4 shows schematically a DC circuit breaker according to a second embodiment of the invention.

A DC circuit breaker according to a second embodiment of the invention is shown in FIG. 4 and is designated generally by the reference numeral 110. The DC circuit breaker 110 of FIG. 4 is similar in structure and operation to the DC circuit breaker 10 of FIGS. 1 and 3, and like features share the same reference numerals.

The DC circuit breaker 110 of FIG. 4 differs from the DC circuit breaker 10 of FIGS. 1 and 3 in that, in the DC circuit breaker 110 of FIG. 4, the first switching element 24 includes a pair of IGBTs connected in series with the mechanical switching element 26, the second switching element 32 includes a pair of gas tube switches connected in anti-parallel, and the switching apparatus includes a pair of inductors 44a,44b. In the first current-conductive branch 12, the IGBTs are connected in inverse series. In the second current-conductive branch 14, each gas tube switch is connected to a respective gate drive. A first of the inductors 44a is connected in series with the first DC terminal 18 and is mutually coupled with a first secondary transformer winding 46b, which in turn is electrically coupled to the gate drive of one of the gas tube switches. A second of the inductors 44b is connected in series with the second DC terminal 20 and is mutually coupled with a second secondary transformer winding 46b, which in turn is electrically coupled to the gate drive of the other of the gas tube switches.

In this way one IGBT-gas tube switch pair 24,32 is configured to selectively permit and block a flow of current in the first and second current-conductive branches 12,14 in one direction between the first and second DC terminals 18,20, and the other IGBT-gas tube switch pair 24,32 is configured to selectively permit and block a flow of current in the first and second current-conductive branches 12,14 in the other direction between the first and second DC terminals 18,20.

The configuration of the DC circuit breaker 110 of FIG. 4 enables the fault current interruption process to be carried out in respect of fault currents in both directions between the first and second DC terminals 18,20. More specifically, the fault current interruption process for a fault current flowing from the first DC terminal 18 to the second DC terminal 20 is carried out by way of the switching of one of the IGBT-gas tube switch pairs 24,32, and the fault current interruption process for a fault current flowing from the second DC terminal 20 to the first DC terminal 18 is carried out by way of the switching of the other of the IGBT-gas tube switch pairs 24,32.

It is envisaged that, in other embodiments of the invention, the DC circuit breaker may include a plurality of switching apparatus in order to increase the interruption capabilities of the DC circuit breaker.

Figure 5:
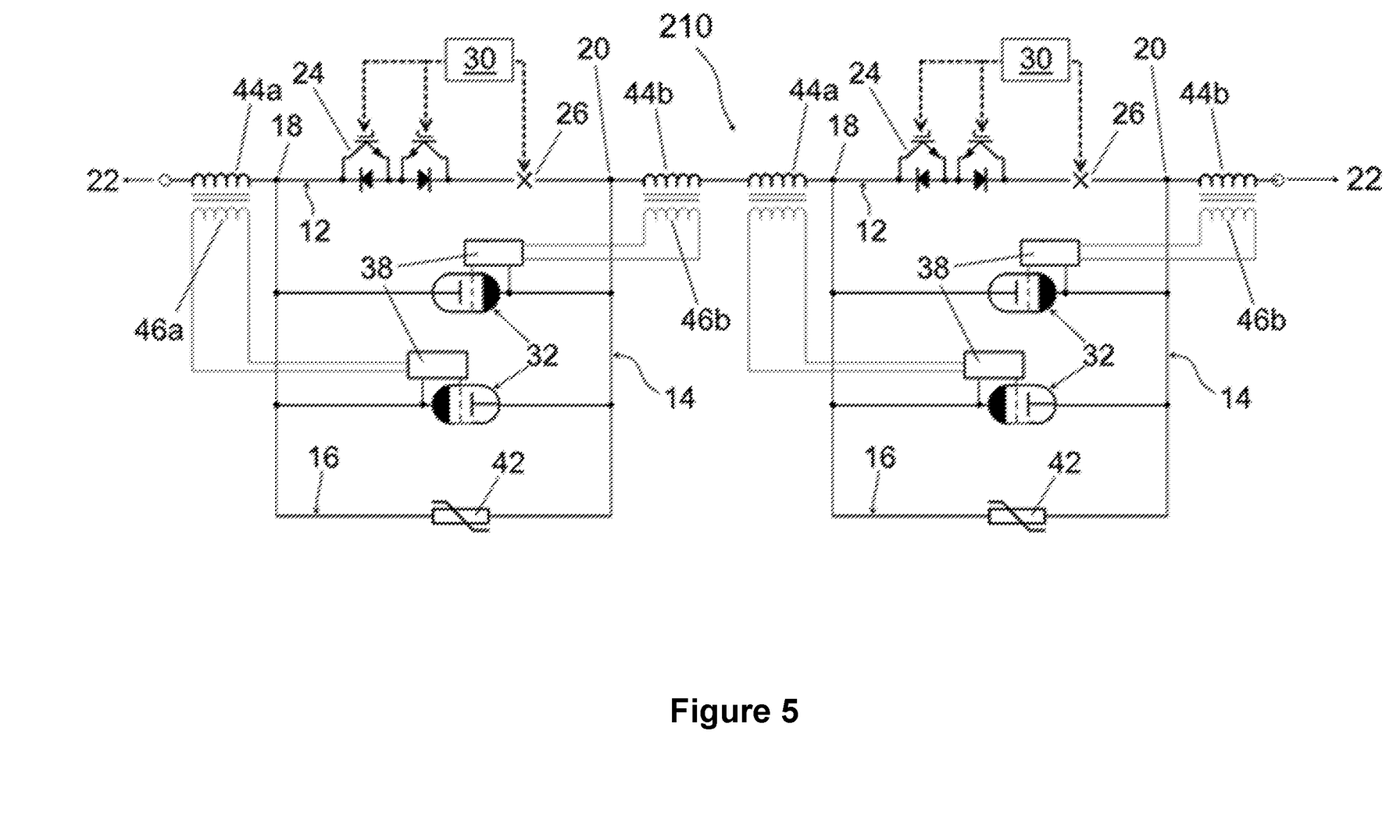
FIG. 5 shows schematically a DC circuit breaker according to a third embodiment of the invention.

A DC circuit breaker according to a third embodiment of the invention is shown in FIG. 5 and is designated generally by the reference numeral 210. The DC circuit breaker 210 of FIG. 5 is similar in structure and operation to the DC circuit breaker 110 of FIG. 4, and like features share the same reference numerals.

The DC circuit breaker 210 of FIG. 5 differs from the DC circuit breaker 110 of FIG. 4 in that the DC circuit breaker 210 of FIG. 5 includes two switching apparatus connected in series, each of the switching apparatus of FIG. 5 being identical in structure and operation to the switching apparatus of FIG. 4. This has the benefit of increasing the voltage rating of the DC circuit breaker 210.

It is envisaged that, in other embodiments of the invention, the DC circuit breaker 210 may include more than two switching apparatus connected in series.

It is also envisaged that, in still other embodiments of the invention, the transformers (the mutually coupled inductors and secondary transformer windings) connected between the two switching apparatus of the DC circuit breaker 210 may be combined into a single three-winding transformer to provide power to the gate drives of the corresponding gas tube switches.

Figure 6:
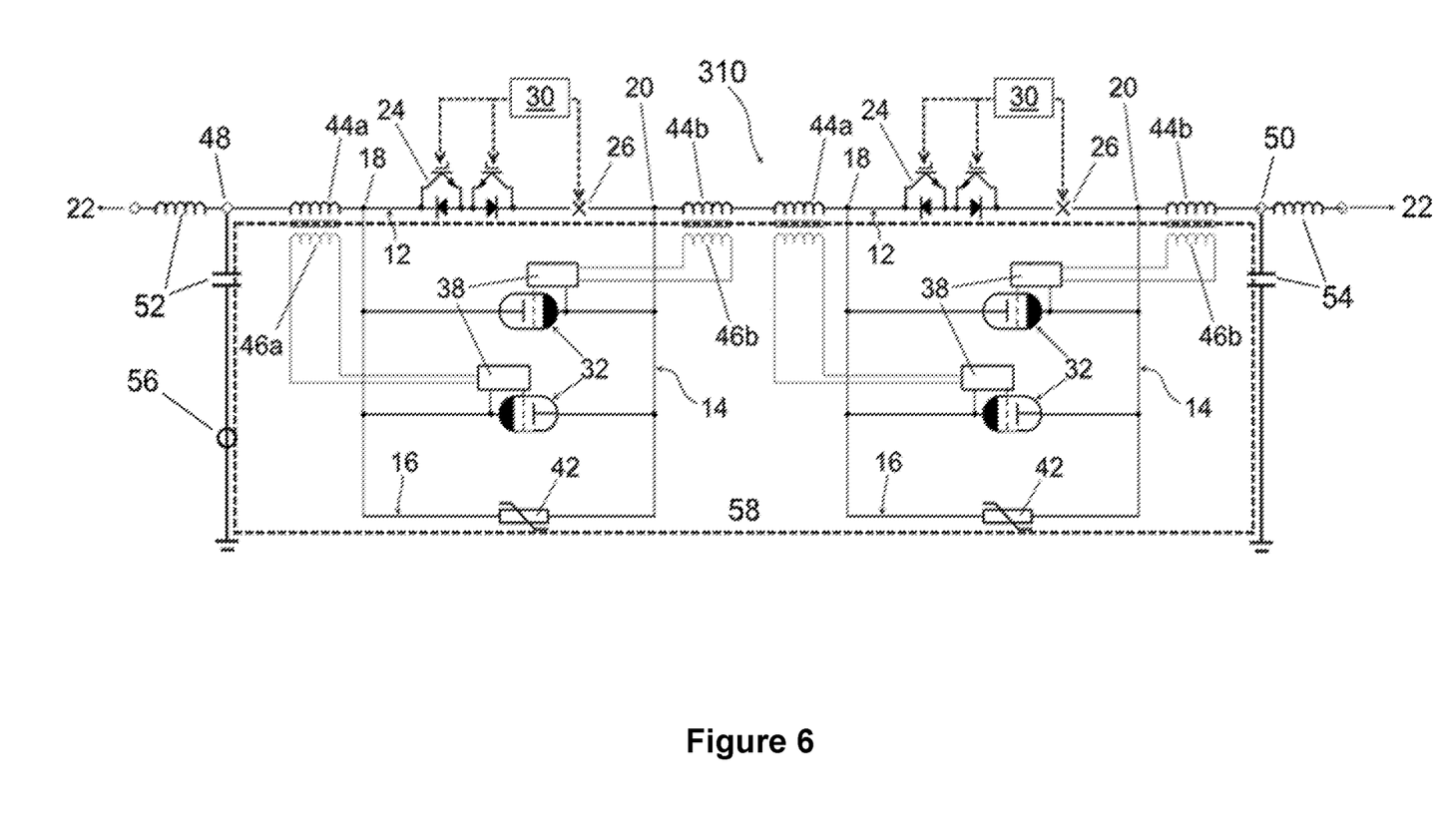
FIG. 6 shows schematically a DC circuit breaker according to a fourth embodiment of the invention.

A DC circuit breaker according to a fourth embodiment of the invention is shown in FIG. 6 and is designated generally by the reference numeral 310. The DC circuit breaker 310 of FIG. 6 is similar in structure and operation to the DC circuit breaker 210 of FIG. 5, and like features share the same reference numerals.

The DC circuit breaker 310 of FIG. 6 differs from the DC circuit breaker 210 of FIG. 5 in that, in the DC circuit breaker 310 of FIG. 6, the pair of switching apparatus are connected in series between first and second nodes 48,50, a first line trap 52 is connected to the first node 48, and a second line trap 54 is connected to the second node 50. Each line trap 52,54 includes a blocking inductor and a shunt capacitor. The blocking inductor of the first line trap 52 is connected in series with the first node 48 and the switching apparatus, while the shunt capacitor of the first line trap 52 is connected between the first node 48 and ground. The blocking inductor of the second line trap 54 is connected in series with the second node 50 and the switching apparatus, while the shunt capacitor of the second line trap 54 is connected between the second node 50 and ground. The DC circuit breaker further includes a high-frequency current transformer 56, which in the embodiment shown is connected in series between ground and a low-voltage terminal of the shunt capacitor of the first line trap 52.

During the normal operation of the DC circuit breaker 310, the gas tube switch may require a small amount of auxiliary power to continuously power one or more auxiliary systems of the gas tube switch. For the purposes of this specification, the purpose of an auxiliary system of the gas tube switch is to carry out an auxiliary operation of the gas tube switch, which is not the turn-on or turn-off of the gas tube switch. The auxiliary operations may include:

operating at least one monitoring device (e.g. a current sensor, a voltage sensor, a gas pressure sensor, a temperature sensor) to monitor an operating state (e.g. current, voltage, internal gas pressure, temperature) of each gas tube switch;

operating each "keep-alive" grid electrode to control a respective electric field in each gas tube switch so as to maintain a respective conductive plasma in each gas tube switch;

operating at least one gas pressure controller, such as a pumping system, to control an internal gas pressure in each gas tube switch.

To provide the required auxiliary power, each inductor 44a,44b of the DC circuit breaker 310 is configured as a power source compatible with the power requirements of one or more auxiliary operations of each gas tube switch. In such embodiments, each inductor 44a,44b of the DC circuit breaker 310 may be connected, via a galvanically isolated electrical connection such as a transformer arrangement, to one or more auxiliary systems of each gas tube switch.

The line traps 52,54 and the current transformer 56 together form a current injection circuit. In use, the current transformer 56 is operated to inject a high-frequency alternating current 58 that flows from ground, through the shunt capacitor of the first line trap 52, through the first current-conductive branches 12 of the DC circuit breaker 310, through the shunt capacitor of the second line trap 54, and back to ground, thus completing a current loop. It is envisaged that, in other embodiments, the current transformer 56 may be located at a different point that enables the injection of the high-frequency alternating current 58 into the current loop. The injected high-frequency alternating current 58 is superimposed on the main DC load current flowing through the DC circuit breaker 310. The shunt capacitors and blocking inductors of the line traps 52,54 act to prevent the injected high-frequency alternating current 58 from escaping to the DC electrical network 22.

The injection of the high-frequency alternating current 58 ensures that there is a small alternating voltage present across each inductor 44a,44b of the DC circuit breaker 310, thus providing a mechanism for supplying the auxiliary power to the auxiliary systems of the gas tube switches even when the main DC load current is constant (or substantially constant). This permits the inductors 44a,44b to provide a continuous supply of auxiliary power for enabling the auxiliary operations of the auxiliary systems of the gas tube switches.

Meanwhile the IGBTs of the first current-conductive branches 12 of the DC circuit breaker 310 are kept in their closed state to carry out the primary function of conducting the main DC load current during the normal operation of the DC circuit breaker 310.

The provision of the current injection circuit also allows the DC circuit breaker 310 to be operated as a load-break switch to open and close under load. Although the main DC load current would be constant (or substantially constant) and thereby cannot be used as a reliable source for deriving power to enable the turn-on and turn-off of the gas tube switches, the current injection circuit by injecting the high-frequency alternating current 58 provides the required change in current for generating a voltage across each inductor 44a,44b in order to provide a power source for enabling the turn-on and turn-off of the gas tube switches.

It will be appreciated that the current injection circuit shown in FIG. 6 is applicable mutatis mutandis to other embodiments of the invention, for example the DC circuit breakers 10,110 of FIGS. 1, 3 and 4.

The configuration of the switching apparatus of the invention therefore not only provides a power supply mechanism by which the energy for powering the gas tube switch(es) can be derived from a current flowing through the switching apparatus of the DC circuit breaker 10,110,210,310, thus obviating the need for a stand-alone power source for the gas tube switch, but also permits the supply of energy from the current flowing through the switching apparatus to the gas tube switch(es), via the inductance element 44,44a,44b, even when the DC circuit breaker 10,110,210,310 is designed to operate at high voltage levels which may be incompatible with the power requirements of the operation of the gas tube switch(es).

It will be appreciated that the DC circuit breakers 10,110, 210,310 in the embodiments shown are selected to help illustrate the working of the invention, and is not intended to be limiting on the scope of applications to which the switching apparatus can be applied. The switching apparatus may be applicable to other types of electrical assemblies with switching capabilities, particularly other types of electrical assemblies requiring a commutation of a current between parallel-connected current-conductive branches.

It will also be appreciated that the type and number of components in the switching apparatus may vary depending on the design requirements of the DC circuit breaker. It is envisaged that, in other embodiments of the invention, the first switching element may include a plurality of switching devices (e.g. series-connected and/or parallel-connected switching devices), the mechanical switching element may include a plurality of mechanical switches (e.g. series-connected and/or parallel-connected mechanical switches), the second switching element may include a plurality of gas tube switches (e.g. series-connected and/or parallel-connected gas tube switches), the energy absorption branch may include a plurality of energy absorption devices (e.g. series-connected and/or parallel-connected energy absorption devices), and/or the inductance element may include a plurality of inductors (e.g. series-connected and/or parallel-connected inductors). It is also envisaged that, in still other embodiments of the invention, each IGBT may be replaced by a different type of semiconductor switching device, and/or the mechanical switching element may additionally or alternatively include a different type of mechanical switch.

The invention claimed is:

1. A switching apparatus comprising:
    a first current-conductive branch including a first switching element, the first switching element configured to be switchable to selectively permit and block a flow of current in the first current-conductive branch;
    a second current-conductive branch including a second switching element, the second switching element configured to be switchable to selectively permit and block a flow of current in the second current-conductive branch; and
    first and second terminals for connection, in use, to an electrical network, wherein the first and second current-conductive branches extend between the first and second terminals,
    wherein the switching apparatus further includes an inductance element configured to carry, in use, a current flowing through the switching apparatus,
    wherein the switching apparatus further comprises a secondary winding electrically coupled to a gate drive of the second switching element, the inductance element being mutually coupled with the secondary winding in such a way that the inductance element is electrically coupled to the second switching element through the secondary winding and that the inductance elements is configured as a power source for enabling the operation of the second switching element with a galvanic isolation from the first current-conductive branch.

2. The switching apparatus according to claim 1 wherein the inductance element is connected in series with the first or second terminal.

3. The switching apparatus according to claim 1 wherein the operation of the second switching element includes at least one of:
   a turn-on of the second switching element; and
   a turn-off of the second switching element.

4. The switching apparatus according to claim 1 wherein the second switching element includes at least one gas tube switch.

5. The switching apparatus according to claim 4 wherein the operation of the second switching element includes at least one of:
   operating at least one monitoring device to monitor an operating state of the or each gas tube switch, wherein the switching apparatus includes the or each monitoring device;
   operating an or a respective electrode to control an or a respective electric field in the or each gas tube switch so as to maintain a or a respective conductive plasma in the or each gas tube switch, wherein the or each gas tube switch includes the or the respective electrode; and
   operating at least one gas pressure controller to control an internal gas pressure in the or each gas tube switch, wherein the switching apparatus includes the or each gas pressure controller.

6. The switching apparatus according to claim 1 wherein the inductance element is electrically coupled to the second switching element to form a galvanically isolated electrical connection between the inductance element and the second switching element, and the galvanically isolated electrical connection is arranged to configure the inductance element as a power source for enabling the operation of the second switching element.

7. The switching apparatus according to claim 6 wherein the galvanically isolated electrical connection includes a transformer.

8. The switching apparatus according to claim 1 wherein the inductance element and a cathode terminal of the second switching element are connected to a common node.

9. The switching apparatus according to claim 1 wherein each of the first and second switching elements is configured as a unidirectional or bidirectional switching element.

10. An electrical assembly comprising at least one switching apparatus according to claim 1.

11. The electrical assembly according to claim 10 including a current injection circuit configured to inject an alternating current to flow through the inductance element of the or each switching apparatus.

12. The electrical assembly according to claim 11 wherein the current injection circuit includes a current transformer.

13. The electrical assembly according to claim 11 including at least one line trap configured to confine the injected alternating current in a current loop including the inductance element of the or each switching apparatus.

14. The electrical assembly according to claim 10 including a plurality of switching apparatus connected in series.

15. The electrical assembly according to claim 10 wherein the electrical assembly is a circuit interruption device.

* * * * *